United States Patent [19]

Okada et al.

[11] Patent Number: 5,010,296
[45] Date of Patent: Apr. 23, 1991

[54] WAFER PROBER

[75] Inventors: Kazuhisa Okada, Itami; Ichirou Kusumoto, Kawanishi, both of Japan

[73] Assignee: Mitsubishi Denki Kabushiki Kaisha, Japan

[21] Appl. No.: 492,051

[22] Filed: Mar. 12, 1990

[30] Foreign Application Priority Data

Dec. 13, 1989 [JP] Japan ................................. 1-321470

[51] Int. Cl.$^5$ ........................ G01R 1/06; G01R 31/02
[52] U.S. Cl. .............................. 324/158 P; 324/158 F
[58] Field of Search ............... 324/158 P, 158 F, 72.5, 324/73.1

[56] References Cited

U.S. PATENT DOCUMENTS 4,791,364 12/1988 Kufis et al. ...................... 324/158 P

FOREIGN PATENT DOCUMENTS 0011243 1/1987 Japan ............................... 324/158 P
0058651 3/1987 Japan ............................... 324/158 P
0132332 6/1987 Japan ............................... 324/158 P
0000742 1/1989 Japan ............................... 324/158 P Primary Examiner—Ernest F. Karlsen
Attorney, Agent, or Firm—Leydig, Voit & Mayer

[57] ABSTRACT

A wafer prober includes a supporting device for supporting a wafer on which a plurality of electrode pads are disposed, a plurality of probes for contacting respective electrode pads, a spraying device for spraying a gas onto the electrode pads contacted by the plurality of probes, and an aspirating device for aspirating waste generated by the contact of the probes with the electrode pads and carried by the gas.

7 Claims, 3 Drawing Sheets

WAFER PROBER

BACKGROUND OF THE INVENTION

1. Field of the Invention

The present invention relates to a wafer prober which tests the electrical characteristics of a wafer chip.

2. Description of the Related Art

Generally, when the electrical characteristics of a wafer chip are tested, respective probes contact a plurality of microscopic electrode pads on a chip and the electrical test is performed through these probes. These contacting operations from the initiation to the termination of the test in the conventional wafer prober are shown in FIGS. 5 A to 5 D.

At first, as shown in FIG. 5 A, a probe 1 is brought close to an electrode pad 2 made of aluminium disposed on a wafer chip 3. Internal aluminium wiring 4 is disposed on the wafer chip 3 near the electrode pad 2. Subsequently, as shown in FIG. 5 B, the probe 1 is brought into contact with the electrode pad 2 under a specified pressure. At this time, the surface of the electrode pad 2 is scraped to some extent by the tip of the probe 1 because of the pressure applied to the probe 1 and the elasticity of the probe 1. Therefore, waste aluminium 5 scraped from the electrode pad 2 is left around the tip of the probe 1.

Under these conditions, an electrical test for the wafer chip 3 is performed by a testing device (not shown) through the probe 1. When the test is completed, the probe 1 is separated from the electrode pad 2 on the wafer chip 3, as shown in FIG. 5 C. However, the waste aluminium 5 left around the tip is scattered all around because of the elasticity of the probe 1. As a result, a gap between the electrode pad 2 on the wafer chip 3 and the internal aluminium wiring 4 next to the electrode pad 2 is sometimes jammed with the waste aluminium 5. Furthermore, as shown in FIG. 5 D, when the probe 1 is moved from the wafer chip 3 in order to test the next chip after completion of the testing the previous chip 3, the waste aluminium 5 attached to the tip of the probe 1 sometimes falls into the gap between the electrode pad 2 and the internal aluminium wiring 4.

The gaps between the internal aluminium wirings 4 are extremely narrow as a result of the progress in the miniaturization of the semiconductor device. Consequently, the electrode pad 2 is easily short-circuited by the internal aluminium wiring 4 when the gap between the electrode pad 2 and the internal aluminium wiring 4 is jammed with the waste aluminium 5, as above described. As a result, there is a problem in that there is an increase in the number of chips which are judged to be inferior by the test and the yield therefore decreases. Furthermore, some chips which are judged to be satisfactory and, therefore, covered with a glass coating or resin molded as finished goods, are contaminated by the waste aluminium 5 and subsequently fail.

SUMMARY OF THE INVENTION

The present invention has been devised to solve the above described problems. An object of this invention is to provide a wafer prober which can improve the yield of a semiconductor device and the quality of the finished product.

A wafer prober according to the present invention has supporting means for supporting a wafer which has a plurality of electrode pads formed on its surface, a plurality of probes electrically connected to respective electrode pads formed on the wafer, a testing means for testing the electrical characteristics of the wafer through the probes, spraying means for spraying a gas to a part of the electrode pads which is in contact with the probes at least while the probes are in contact with the electrode pads on the wafer, and aspirating means for aspirating waste generated by contacting the probes with the electrode pads on the wafer together with the gas sprayed by the spraying means.

DESCRIPTION OF THE PREFERRED EMBODIMENT

The embodiment of the present invention will be explained as follows together with reference to the attached figures.

Figure 1:
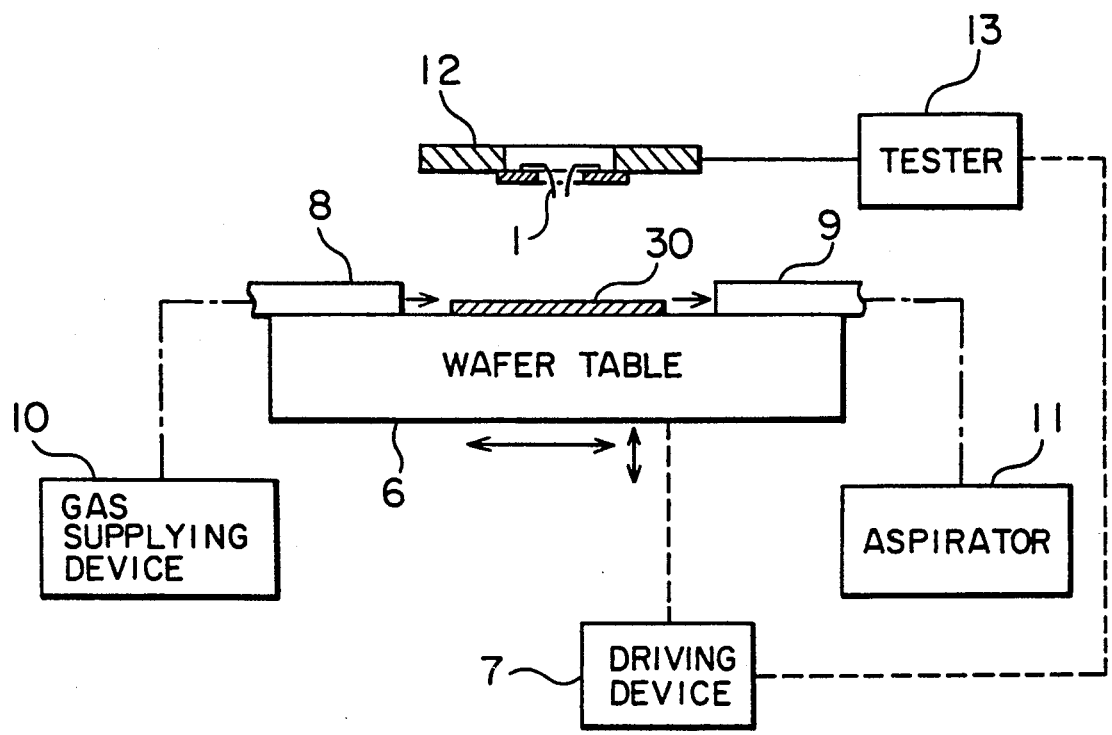
FIG. 1 is a block diagram of the construction of the wafer prober according to one embodiment of the present invention.

In FIG. 1, the wafer prober has a wafer table 6 for supporting a wafer 30. This wafer table 6 is mounted on a driving device 7 so that it can freely move both up and down and to the left and right. A spray nozzle 8 and a suction duct 9 are arranged on the wafer table 6 with the supported wafer 30 therebetween. The spray nozzle 8 and the suction duct 9 are connected to a gas supplying device 10 and an aspirator 11, respectively. A probe card 12, on which a plurality of probes 1 are mounted, is arranged upward of the wafer 30 supported on the wafer table 6. Each of the probes 1 on this probe card 12 is electrically connected to a tester 13. The driving device 7 is electrically connected to this tester 13.

Figure 2:
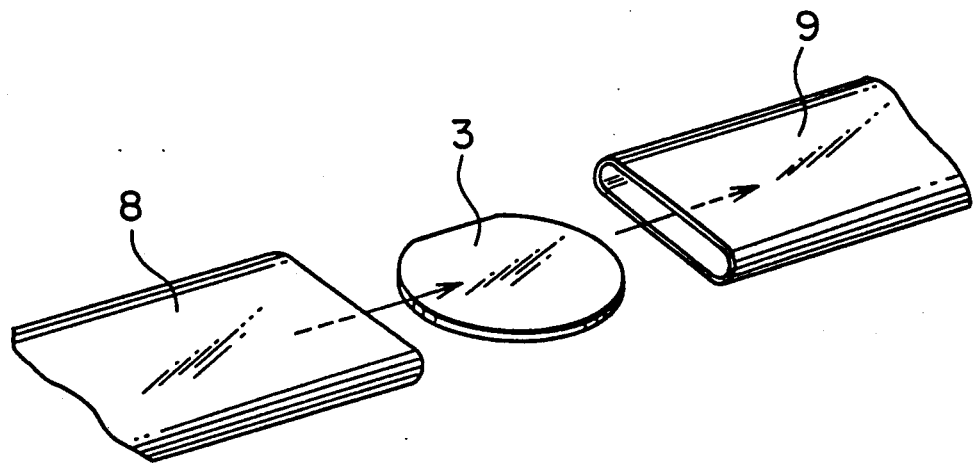
FIG. 2 is a perspective view of the principal part of the embodiment shown in FIG. 1.

As shown in FIG. 2, the spray nozzle 8 and the suction duct 9 have a relatively flat cross-sectional shape so that the gas can be sprayed onto the whole surface of the wafer 30 and can be aspirated simultaneously.

The operation of this embodiment will be explained. The wafer 30 to be tested is supported on the wafer table 6. A plurality of chips (not shown) are formed on this wafer 30 and a plurality of the electrode pads (not shown) are formed on the surface of each chip.

The gas supplying device 10 and the aspirator 11 are driven and gas supplied from the gas supplying device 10 is sprayed onto the wafer 30 from the nozzle 8 and is aspirated through the duct 9. The gas is continuously sprayed until the test for one wafer 30 is completed.

At this stage, the driving device 7 moves the wafer table 6 according to the instruction of the tester 13 and positions the chip on the wafer 30 to be initially tested directly under the probes 1 on the probe card 12. Next, the driving device 7 raises the wafer table 6 and the electrode pads on the chip to contact the probes 1. Thus, the chip in the wafer 30 is electrically connected to the tester 13. After that, the electrical characteristics of the chip are tested by the tester 13 through the probes 1.

When the test of one chip is completed, the wafer table 6 is lowered by the driving device 7 and the electrode pads on the chip are separated from the probes 1. The wafer table 6 is moved in a horizontal plane so that the next chip is positioned directly under the probes 1 and the test for the next chip is similarly performed.

When the test for the all of the chips on the wafer 30 is completed, the spraying of the gas is terminated by stopping the gas supplying device 10 and the aspirator 11 and the tested wafer 30 is replaced with an untested wafer.

Figure 3:
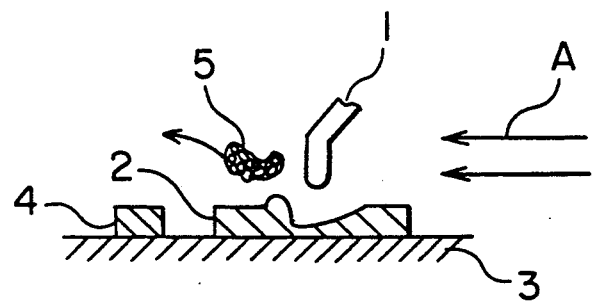
FIG. 3 is a sectional view of the operation of the embodiment shown in FIG. 1.

In this embodiment, since the gas is continuously sprayed until the test for one wafer is completed, waste aluminium 5 generated after an electrode pad 2 is scraped by the tip of the probe 1 is blown away by a stream of gas A when the probe 1 contacts or separates from the electrode pad 2 on a wafer chip 3 and is aspirated into the duct 9, as shown in FIG. 3. Therefore, an electrical short circuit which might occur after the gaps between the electrode pad 2 and internal aluminium wiring 4 or between the internal aluminium wirings 4 neighboring each other are jammed with the waste aluminium 5, is prevented. In addition, even if the waste aluminium 5 attached to the tip of the probe 1 falls down when the wafer table 6 is moved in order to test the next wafer chip, the waste aluminium 5 is blown away by the gas sprayed from the nozzle 8 and is aspirated by the duct 9.

As for the gas supplied from the gas supplying device 10, an inactive gas, such as $N_2$, or dried air, can be used.

In addition, the operations of the gas supplying device 10 and the aspirator 11 can be controlled by the tester 13 so that the gas is sprayed synchronously with testing of the wafer 30.

Furthermore, the spray nozzle 8 and the suction duct 9 are not necessarily limited in number to one and a plurality of spray nozzles 8 and suction ducts 9 can be installed.

In the above described embodiment, the probe card 12 is fixedly mounted and the wafer table 6 is mounted so that it can be freely moved. However, the wafer table 6 may be fixedly mounted and the probe card 12 mounted so that it can be freely moved.

Figure 4:
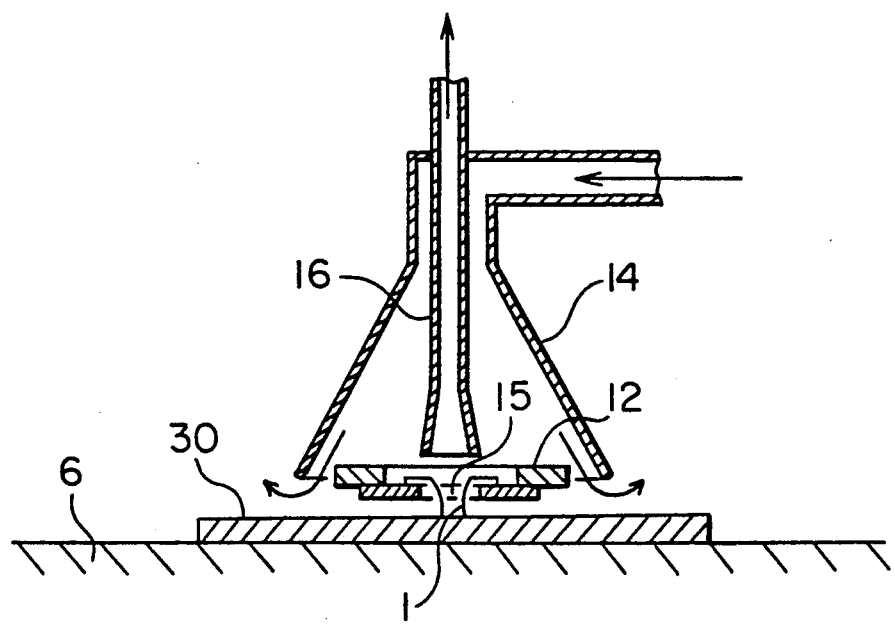
FIG. 4 is a sectional view of the principal part of another embodiment of the present invention.
Figure 5A:
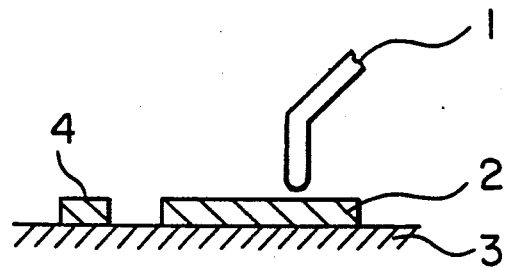
FIGS. 5 A to 5 D are sectional views of the contacting operation of from the initiation to the termination of the test in a conventional wafer prober.
Figure 5B:
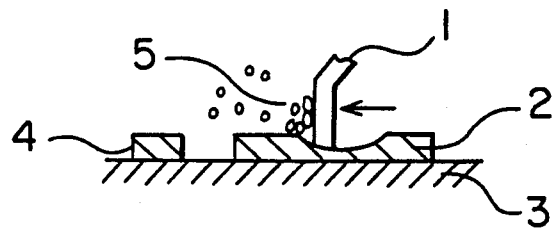
Figure 5C:
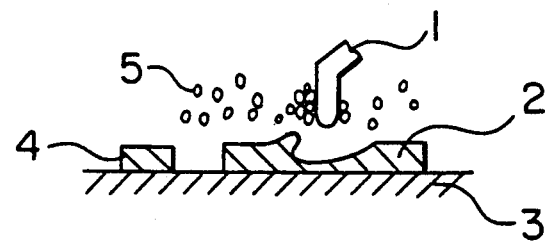
Figure 5D:
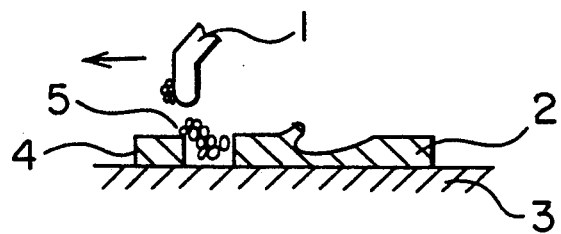

As for the method of spraying the gas onto the wafer 30, Bernoulli's principle can be applied, as shown in FIG. 4. The duplex tube structure shown is formed by installing a cover 14 that spreads out to cover the whole probe card 12. A suction duct 16 opens opposite a through hole 15 formed at the center part of the probe card 12 where the probes 1 are located. When gas is supplied to the cover 14, the gas passes between the outer circumference of the probe card 12 and the inner wall of the cover 14. Part of the gas is sprayed onto the contacting part of the probe 1 and the wafer 30 while the other part of the gas flows out of the cover 14 as shown by arrows in FIG. 4. In consequence, a vacuum is formed inside of the cover 14 so that the waste generated at the contacting part is aspirated to the suction duct 16 carried by some of the gas, through the through hole 15 of the probe card 12.

What is claimed is:

1. A wafer prober comprising:
   supporting means for supporting a wafer having a plurality of electrode pads disposed on a surface thereof;
   a plurality of probes for contacting respective electrode pads on a wafer supported by said supporting means;
   a nozzle having a nozzle opening for spraying a gas onto the electrode pads on the wafer contacted by said probes; and
   a suction duct having a duct opening for aspirating waste generated by contacting said plurality of probes with the plurality of electrode pads on the wafer and carried by gas sprayed through said nozzle wherein said nozzle opening and said duct opening are disposed directly opposite each other and said plurality of probes are disposed therebetween.

2. A wafer prober according to claim 1 wherein said supporting means includes a wafer table and driving means for moving said wafer table relative to said probes.

3. A wafer prober according to claim 1 wherein said nozzle opening and duct opening have substantially the same shape.

4. A wafer prober according to claim 3 wherein said nozzle opening and duct opening have substantially the same area.

5. A wafer prober according to claim 3 wherein the nozzle and duct openings are elongate.

6. A wafer prober comprising:
   supporting means for supporting a wafer having a plurality of electrode pads disposed thereon;
   a plurality of probes for contacting respective electrode pads on a wafer supported by said supporting means;
   a probe card for supporting the plurality of probes and including a central through hole;
   a cover including a conical portion including a base having a cover opening at the base for covering said probe card and a wafer supported by said supporting means and including a gas inlet for admitting a gas sprayed on the electrode pads on the wafer contacted by said probes within said cover; and
   a suction duct disposed within said cover and co-axially mounted with said conical portion of said cover including a duct opening for aspirating waste generated by contacting the plurality of probes with respective electrode pads on the wafer and carried by a gas admitted through said gas inlet.

7. A wafer prober according to claim 6 wherein said suction duct includes a generally conical duct portion having a base, said conical duct portion being disposed adjacent the duct opening, the duct opening being disposed at said base of said conical duct portion.

* * * * *